United States Patent
Watanabe et al.

(10) Patent No.: US 8,633,511 B2
(45) Date of Patent: Jan. 21, 2014

(54) METHOD OF PRODUCING SEMICONDUCTOR DEVICE PACKAGING HAVING CHIPS ATTACHED TO ISLANDS SEPARATELY AND COVERED BY ENCAPSULATION MATERIAL

(75) Inventors: Masakazu Watanabe, Ota (JP); Takashi Kuramochi, Oizumi-machi (JP); Masahiro Hatanai, Ota (JP)

(73) Assignee: ON Semiconductor Trading, Ltd., Hamilton (BM)

( * ) Notice: Subject to any disclaimer, the term of this patent is extended or adjusted under 35 U.S.C. 154(b) by 0 days.

(21) Appl. No.: 13/203,447

(22) PCT Filed: Feb. 25, 2010

(86) PCT No.: PCT/JP2010/053489
§ 371 (c)(1),
(2), (4) Date: Aug. 25, 2011

(87) PCT Pub. No.: WO2010/098501
PCT Pub. Date: Sep. 2, 2010

(65) Prior Publication Data
US 2011/0309408 A1    Dec. 22, 2011

(30) Foreign Application Priority Data
Feb. 27, 2009  (JP) .................................. 2009-045570

(51) Int. Cl.
*H01L 29/66* (2006.01)
*H01L 23/48* (2006.01)
*H01L 27/11* (2006.01)
*H01L 23/495* (2006.01)

(52) U.S. Cl.
USPC ........... 257/140; 257/177; 257/379; 257/666; 257/676

(58) Field of Classification Search
USPC .................... 257/140, 379, 177, 666, 676
See application file for complete search history.

(56) References Cited

U.S. PATENT DOCUMENTS

| 5,049,977 A * | 9/1991 | Sako ............................. 257/676 |
| 5,309,322 A * | 5/1994 | Wagner et al. ................. 361/723 |
| 5,625,235 A * | 4/1997 | Takiar ............................ 257/776 |
| 5,739,582 A * | 4/1998 | ElHatem et al. .............. 257/676 |
| 5,828,000 A * | 10/1998 | Sano ............................... 174/548 |
| 7,391,100 B2 * | 6/2008 | Luo et al. ...................... 257/666 |
| 2003/0102489 A1 * | 6/2003 | Nam et al. .................... 257/177 |

FOREIGN PATENT DOCUMENTS

| JP | 1-183129 | 7/1989 |
| JP | 6-177312 | 6/1994 |
| JP | 2001-110986 | 4/2001 |
| JP | 2001-320009 | 11/2001 |

OTHER PUBLICATIONS

International Search Report mailed Mar. 30, 2010, directed to International Patent Application No. PCT/JP2010/053489; 2 pages.

* cited by examiner

*Primary Examiner* — Long K Tran
*Assistant Examiner* — Dzung Tran
(74) *Attorney, Agent, or Firm* — Morison & Foerster LLP

(57) ABSTRACT

A semiconductor device provided with: an island and an island which are separated from each other; leads which approach the islands at one end; a control element which is attached to the island and is connected to a lead through a thin metal wire; and a switching element which is attached to the island and is connected to the lead through a metal wire. Further, the thin metal wire and the thin metal wire are arranged so as to the intersect.

6 Claims, 6 Drawing Sheets

METHOD OF PRODUCING SEMICONDUCTOR DEVICE PACKAGING HAVING CHIPS ATTACHED TO ISLANDS SEPARATELY AND COVERED BY ENCAPSULATION MATERIAL

REFERENCE TO RELATED APPLICATIONS

This application is a national stage application under 35 USC 371 of International Application No. PCT/JP2010/053489, filed Feb. 25, 2010, which claims priority from Japanese Patent Application No. 2009-045570, filed Feb. 27, 2009, the contents of which are incorporated herein by reference in their entirety.

FIELD OF THE INVENTION

The present invention relates to a semiconductor device and a method of manufacturing the same, and particularly relates to a semiconductor device in which semiconductor elements connected via thin metal wires are resin-encapsulated and to a method of manufacturing the same.

BACKGROUND OF THE INVENTION

Semiconductor devices are being developed in which a switching element and a control element constituting a power supply circuit or the like are resin-encapsulated into a single package (for example, see Japanese Patent Application Publication No. 2001-320009).

A configuration of a semiconductor device 100 of such type will be described with reference to FIG. 6. The semiconductor device 100 mainly includes a switching element 103, a control element 104, an island 101 on which the switching element 103 is mounted, an island 102 on which the control element 104 is mounted, leads 106 each connected to the control element 104 or the switching element 103 and led out to the outside, and an encapsulating resin 107 for integrally encapsulating the aforementioned parts.

The switching element 103 is a discrete MOSFET, for example, in which a drain electrode on the back surface thereof is connected to the island 101, a gate electrode on the top surface thereof is connected to the control element 104, and a source electrode on the top surface thereof is connected to the lead 106D via a thin metal wire 105. Meanwhile, the control element 104 formed of an LSI is provided with multiple electrodes on the top surface thereof, and is connected to the switching element 103 and the leads 106A, 106B via the thin metal wires 105.

In addition, the leads 106A to 106E are led out from a side surface of the encapsulating resin 107, and the semiconductor device 100 is insert-mounted by inserting these leads into a mount substrate.

A high voltage of several hundred volts is applied to each of the electrode on the back surface of the switching element 103. Meanwhile, the back surface of the control element 104 needs to be insulated from the surroundings. Thus, if the switching element 103 and the control element 104 are fixedly attached to the same land by using a conductive adhesive, the control element 10 whose back surface receives application of a high potential may malfunction.

To prevent this malfunction, in the semiconductor device 100, the island 101 on which the switching element 103 is mounted and the island 102 on which the control element 104 is mounted are formed separately from each other. This configuration eliminates adverse effects that the voltage applied to the switching element 103 produces on the control element.

Moreover, a method of manufacturing the semiconductor device with the configuration described above is as follows. Firstly, a single sheet of conductive foil is etched or pressed to form the island 101, the island 102, and the leads 106 having shapes shown in FIG. 6. Next, the switching element 103 is fixedly attached to the top surface of the island 101, and the control element 104 is fixedly attached to the top surface of the island 102. Then, the switching element 103 and the control element 104 are connected to the predetermined leads via the thin metal wires 105. Subsequently, the island 101, the island 102, and the leads 106 are accommodated in a cavity of a molding die. Thereafter, a step of resin encapsulating is performed by injecting the encapsulating resin 107 into the cavity.

SUMMARY OF THE INVENTION

However, the semiconductor device 100 described above has a problem that the thin metal wire comes into contact with a front end portion of the lead 106B in the step of resin encapsulating.

Specifically, in the step of resin encapsulating described above, the encapsulating resin 107 in a liquid form or a semi-solid form is injected into the cavity at a high pressure in a direction of an arrow shown in FIG. 6. This causes the thin metal wires to receive pressure of the injected encapsulating resin. The pressure of the encapsulating resin acts greatly on the thin metal wire 105A in particular. The reason for this is as follows. Since the thin metal wire 105A connects the control element 104 and the lead 106A disposed in an end portion, the inclination angle of the thin metal wire 105A with respect to the direction in which the encapsulating resin flows is large. Thus, the pressure generated by the injection of the encapsulating resin may cause the thin metal wire 106A to curve in a shape illustrated by a dotted line and to come into contact with the adjacent lead 106B. If the encapsulating resin 107 is cured with the thin metal wire 106A in contact with the lead 106B, the device being in use malfunctions due to occurrence of a short circuit between the thin metal wire 105A and the lead 106B.

The present invention is made in view of the problem described above. A main object of the present invention is to provide a semiconductor device in which a thin metal wire is prevented from causing a short circuit due to an injection pressure of a resin in a step of resin encapsulating and a method of manufacturing the same.

A semiconductor device of the present invention includes: a first island and a second island formed separately from each other; a first semiconductor element fixedly attached to a top surface of the first island; a second semiconductor element fixedly attached to a top surface of the second island; a lead disposed near one end of one side edge of the first island and the second island, a first thin metal wire connecting an electrode of the first semiconductor element with a top surface of the lead near the one end; and a second thin metal wire connecting an electrode of the second semiconductor element with the top surface of the lead near another end. In the semiconductor device, the first thin metal wire extends above the second thin metal wire, and the first thin metal wire and the second thin metal wire cross each other in a plan view.

A method of manufacturing a semiconductor device of the present invention includes the steps of: preparing a first island, a second island formed separately from the first island, and a plurality of leads each having one end located close to the first island or the second island, fixedly attaching a first semiconductor element to a top surface of the first island, and fixedly attaching a second semiconductor element to a top surface of the second island; connecting, by a first thin metal wire, the first semiconductor element with one of the leads disposed near one end of one side edge of the first island and the second island, and connecting the lead and the second semiconductor element by a second thin metal wire crossing the first thin metal wire; and accommodating the two islands, and portions of the leads in a cavity of a molding die, and injecting an encapsulating resin into the cavity from a side near another side edge opposed to the one side edge of the first island and the second island.

According to the present invention, the first thin metal wire which is likely to come into contact with another lead by a pressure generated in the resin encapsulating is disposed to cross the second thin metal wire in a plan view. In this configuration, even if the first thin metal wire is curved by the pressure of the resin encapsulating, the first thin metal wire comes into contact with the second thin metal wire, and thereby excessive deformation of the first thin metal wire is suppressed. As a result, a short circuit caused by the contact of the first thin metal wire with another lead is prevented.

DETAILED DESCRIPTION OF THE INVENTION

A configuration of a semiconductor device 10 according to an embodiment will be described with reference to FIG. 1.

Figure 1A:
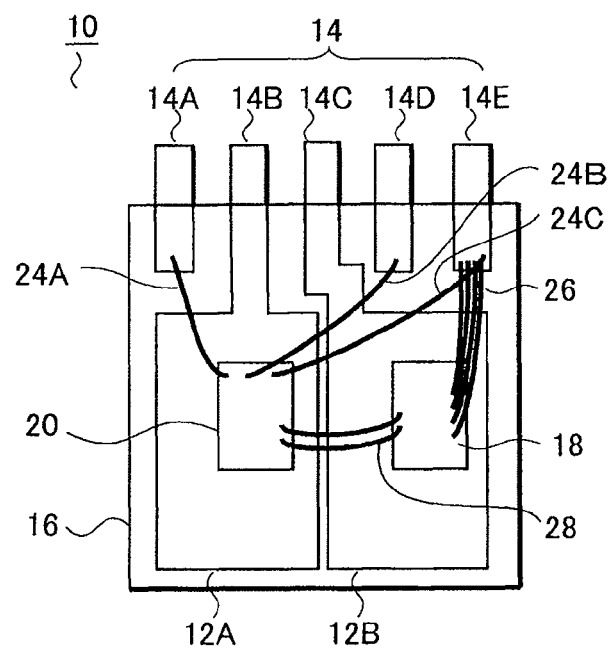
FIG. 1 is a view showing a semiconductor device of the present invention, Part (A) of FIG. 1 is a plan view, Part (B) of FIG. 1 is an enlarged plan view, and Part (C) of FIG. 1 is a cross-sectional view.
Figure 1B:
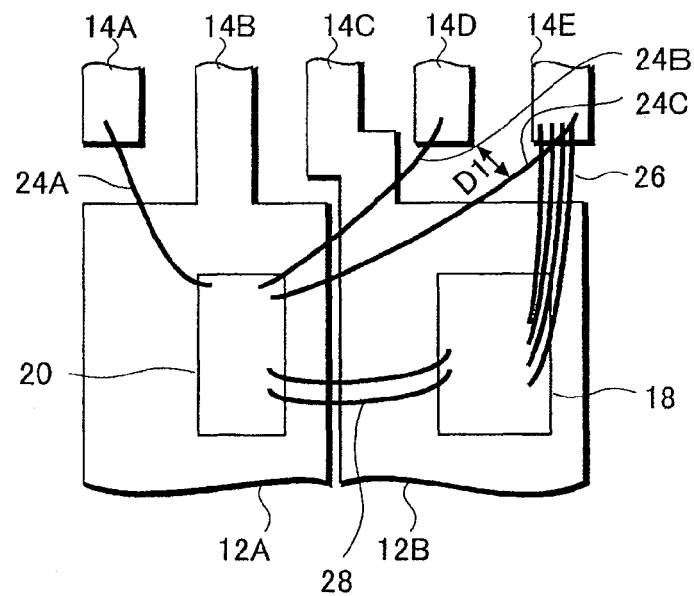
Figure 1C:
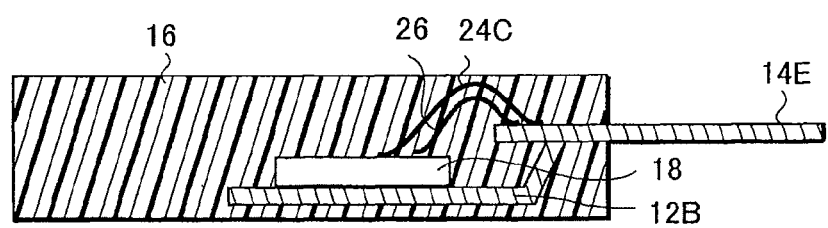

With reference to Part (A) of FIG. 1, the semiconductor device 10 mainly includes an island 12A (first island) and an island 12B (second island) which are separated from each other, a control element 20 (first semiconductor element) which is mounted on a top surface of the island 12A, a switching element 18 (second semiconductor element) which is fixedly attached to a top surface of the island 12B, multiple leads 14 which function as external connection terminals, and an encapsulating resin 16 which integrally covers and mechanically supports the aforementioned parts. Furthermore, the control element 20 is connected to the leads 14 via multiple thin metal wires such as a thin metal wire 24A, and the switching element 18 is connected to a lead 14E via multiple thin metal wires 26.

The island 12A and the island 12B are each formed by shaping a plate into a predetermined shape by etching or punching, the plate having a thickness of about 0.4 mm and being mainly made of copper. The island 12A and the island 12B are each formed slightly larger in a plan view than the circuit element (the control element 20 or the switching element 18) to be mounted on the top surface thereof. Moreover, a lead 14B continuous with the island 12A is led out to the outside, and a lead 14C continuous with the island 12B is led out to the outside. The lead 14B and the lead 14C function as support leads mechanically supporting the island 12A and the island 12B, respectively, in the manufacturing process.

Each of the leads 14 is electrically connected to the corresponding one of the built-in switching element 18 and control element 20, and a portion of the lead 14 is exposed to the outside to serve as the external connection terminal. With reference to Part (A) of FIG. 1, the leads 14A to 14E are arranged along the upper edges (one side edge) of the islands 12A, 12B. The leads 14A, 14D, and 14E are disposed at respective positions higher than the surfaces of the islands 12A, 12B (see, Part (C) of FIG. 1), and are connected to the control element 20 or the switching element 18 via the thin metal wires. Meanwhile, the lead 14B is continuous with the island 12A, and a step is formed in a middle portion thereof. Similarly, the lead 14C is continuous with the island 12B, and a step is formed in a middle portion thereof.

A MOSFET (Metal-Oxide Semiconductor Field Effect Transistor), a bipolar transistor, or an IGBT (Insulated Gate Bipolar Transistor) is used as the switching element 18. If the MOSFET is used as the switching element 18, a drain electrode is formed on the back surface thereof. If the bipolar transistor is used as the switching element 18, a collector electrode is formed on the back surface thereof. Furthermore, a power supply circuit is built in the semiconductor device 10, taken as an example in the embodiment. Thus, a power semiconductor element (power element) which performs switching of a large current of 1 A or more, for example, is used as the switching element 18.

In the embodiment, the MOSFET is used as the switching element 18. A drain electrode on the back surface of the switching element 18 is connected to the top surface of the island 12B with a conductive adhesive placed in between. A gate electrode on the top surface of the switching element 18 is connected to the control element 20 via thin metal wires 28. A source electrode in the top surface of the switching element 18 is connected to the lead 14E via the multiple thin metal wires 26. Hence, the switching element 18 performs switching operation on the basis of a control signal supplied from the control element 20.

The control element 20 is an LSI on a surface of which a circuit to control the switching of the switching element 18 is formed. The control element 20 is fixedly attached to the island 12A in an insulated manner with an insulating sheet attached to the back surface of the element and an insulating adhesive placed in between. The electrodes on the top surface of the control element 20 are connected to the leads 14 and the switching element 18 via the thin metal wires 24. Specifically, the control element 20 is connected to the leads 14A, 14D via the respective thin metal wires 24A, 24B. Moreover, an electrode of the control element 20 and the control electrode of the switching element 18 are connected via the thin metal wires 28. The control element 20 includes an overheat protection circuit which forcedly turns off the switching element 18 upon detecting a temperature of a predetermined level or higher.

Furthermore, the switching element 18 is disposed near the right end of the entire device with respect to the direction in which the leads 14 are arranged (lateral direction in the drawings), and the control element 20 is disposed close to the center portion of the entire device.

In the embodiment, gold wires each having a diameter of 40 μm or less and made of gold are used as thin metal wires 24, 26, 28. The thin gold wires are used to reduce the cost by reducing the used amount of high-cost gold. However, such use causes the mechanical strength of the thin metal wires to be reduced, and the thin metal wires may be deformed in resin encapsulating. In the embodiment, the layout of the thin metal wires is optimized to prevent occurrence of a short circuit due to the deformation of the thin metal wires in the resin encapsulating. This matter will be described later with reference to Part (B) of FIG. 1.

The encapsulating resin 16 has the function of integrally covering portions of the leads 14, the islands 12A, 12B, the switching element 18, the control element 20, and the thin metal wires, and mechanically supporting the entire device. A thermosetting resin such as an epoxy resin or a thermoplastic resin such as an acryl resin is used as the material of the encapsulating resin 16. Moreover, the encapsulating resin 16 is made of a resin material into which a filler such as granular silica or alumina is mixed to improve heat dissipation and to suppress a stress occurring due to difference in thermal expansion coefficient between the Si chips and the resin.

A configuration of the thin metal wire 24C and the thin metal wires 26 will be described with reference to Part (B) of FIG. 1. The lead 14E disposed in the right end portion of the device is connected to a potential of a power source, and is connected to both of the control element 20 and the switching element 18. Specifically, the lead 14E is connected to the control element 20 via the thin metal wire 24C, and is connected to the source electrode of the switching element via the multiple thin metal wires 26. Here, the length of the thin metal wire 24C is 3 mm or more, for example.

One end of the thin metal wire 24C is connected to the electrode of the control element 20, and the other end thereof is connected to the lead 14E. To be specific, the other end of the thin metal wire 24C is connected to a region which is on the right side (outer side) of the center portion of the lead 14E. This configuration allows the thin metal wire 24C to be positioned away from the lead 14D adjacent to the lead 14E. Specifically, a distance D1 by which the lead 14D is positioned away from the thin metal wire 24C is 0.5 mm or more, for example. The lead 14E is connected to a ground potential. Meanwhile, a signal for control passes through the lead 14D, the signal having a potential different from the ground potential. Thus, this configuration prevents a short circuit from occurring which may occur if the thin metal wire 24C connected to the lead 14E should come into contact with the lead 14D.

One end of each of the thin metal wires 26 is connected to the electrode provided on the top surface of the switching element 18, and the other end thereof is connected to the top surface of the lead 14E. Note that the other ends of some of the thin metal wires 26 are connected to a region on the left side (inner side) with respect to the center of the top surface of the lead 14E.

Furthermore, the thin metal wire 24C is arranged to cross the thin metal wires 26 at positions above the thin metal wires 26. This configuration suppresses the deformation of the thin metal wire 24C. Specifically, as shown in Part (B) of FIG. 1, the thin metal wire 24C connects the control element 20 disposed in the central portion and the lead 14E in the end portion. Accordingly, a larger pressure is applied to the thin metal wire 24C than the other thin metal wires by the flow of the encapsulating resin supplied in the step of resin encapsulating in the manufacturing process. Thus, the thin metal wire 24C is under an easy-to-deform condition, and the deformation thereof needs to be suppressed to prevent the short circuit described above. Furthermore, with reference to Part (C) of FIG. 1, the lead 14E (post) to which the thin metal wires are connected is disposed above the switching element 18 and the control element 20. Thus, if the thin metal wire 24C connecting the control element 20 and the lead 14E deforms to the right in the drawing by the injection pressure of the resin, the thin metal wire 24C easily comes into contact with a lower end of the lead 14D shown in Part (B) of FIG. 1.

In the embodiment, in order to prevent the short circuit described above, the thin metal wire 24C is disposed to cross the thin metal wires 26 at the positions thereabove. This configuration enables the thin metal wire 24C to be supported by the thin metal wires 26 even if the thin metal wire 24C is deformed toward the lead 14D by the filling pressure of the resin. As a result, the deformation of the thin metal wire 24C is suppressed, and the contact of the thin metal wire 24C with the lead 14D is prevented. This configuration is achievable for the following reason. The thin metal wire 24C and the thin metal wires 26 are connected to the same lead 14E. Thus, even if the wires come into contact with each other, no failure occurs since the potentials of the wires are the same.

Moreover, in the embodiment, the thin metal wire 24C is supported by the multiple thin metal wires 26. Thus, the supporting force of the multiple thin metal wires 26 supporting the thin metal wire 24C is large, and the effect of preventing the deformation of the thin metal wire 24C is very large. In addition, some of the thin metal wires 26 connected to the lead 14E are connected to a region on the left side (center side) of the center of the top surface of the lead 14E. This configuration allows the thin metal wire 24C and the thin metal wires 26 to surely cross each other in a plan view.

A method of manufacturing the semiconductor device having the configuration described above will be described with reference to FIGS. 2 to 5.

Figure 2A:
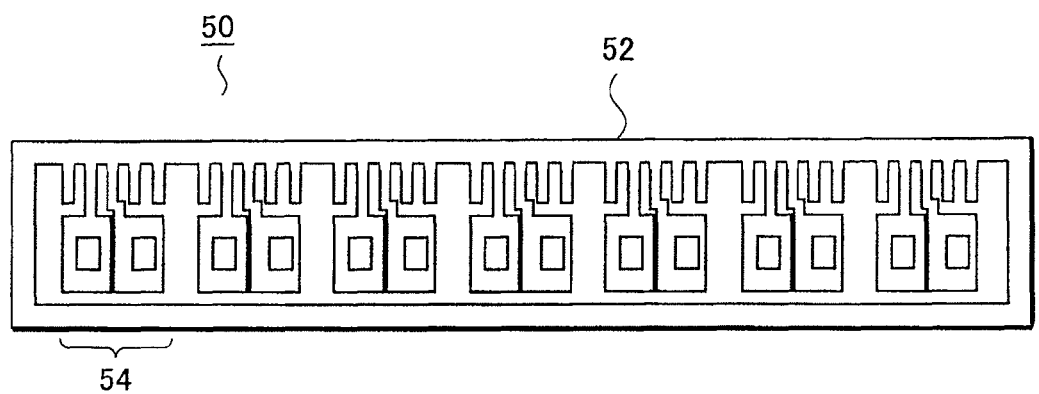
FIG. 2 is a view showing a method of manufacturing the semiconductor device of the present invention, Part (A) of FIG. 2 is a plan view, and Part (B) of FIG. 2 is an enlarged plan view.
Figure 2B:
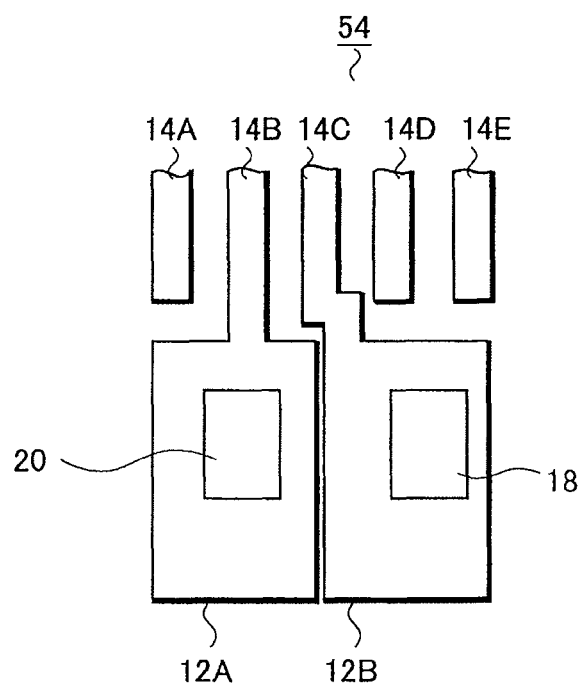

First, with reference to FIG. 2, a lead frame 50 having a predetermined shape is prepared. Part (A) of FIG. 2 is a plan view showing the entire lead frame 50, and Part (B) of FIG. 2 is a perspective view showing units 54 included in the lead frame 50.

With reference to Part (A) of FIG. 2, the external shape of the lead frame 50 is a strip shape, and the multiple units 54 are formed within an outer frame 52 having a frame shape. The unit is herein a portion forming one semiconductor device. Although the drawing shows seven units 54 connected to the outer frame 52 having a picture-frame shape, many units 54 may be provided in a matrix within the outer frame 52. Note that each of steps to be described below is performed on the units 54 of the lead frame 50 collectively.

With reference to Part (B) of FIG. 2, each single unit 54 is formed of two islands 12A, 12B and multiple leads 14A to 14E whose one ends are located close to the islands 12A, 12B. Each of the islands 12A, 12B has such a size that a semiconductor element is mountable on the top surface thereof The lead 14B is integrally extended from the island 12A, and is connected to the outer frame 52. In addition, the lead 14C is integrally extended from the island 12B, and is connected to the outer frame 52. In other words, the lead 14B and the lead 14C also function as support leads to fix the island 12A and the island 12B to the outer frame 52. The one ends of the leads 14A, 14D, 14E are located close to the islands 12A, 12B and the other ends thereof are connected to the outer frame 52.

Furthermore, predetermined circuit elements are mounted respectively on the top surfaces of the island 12A and the island 12B of each unit 54. Specifically, a control element 20 is mounted on the top surface of the island 12A, and a switching element 18 is mounted on the top surface of the island 12B. The control element 20 having a resin sheet attached to the back surface thereof is mounted on the top surface of the island 12A with an insulating adhesive such as an epoxy resin placed in between. Meanwhile, the switching element 18 is mounted on the top surface of the island 12B with a conductive fixing agent such as a conductive paste or solder in between. In this configuration, since the control element 20 and the switching element 18 are mounted respectively on the separate islands, no short circuit of the two elements occurs even if the control element 20 is mounted on the island 12A by using the conductive fixing agent.

Figure 3A:
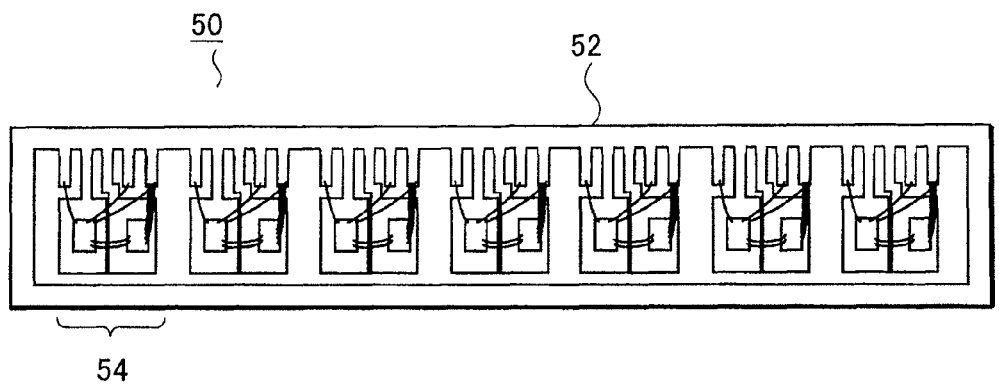
FIG. 3 is a view showing the method of manufacturing the semiconductor device of the present invention, Part (A) of FIG. 3 is a plan view, and Part (B) of FIG. 3 is an enlarged plan view.
Figure 3B:
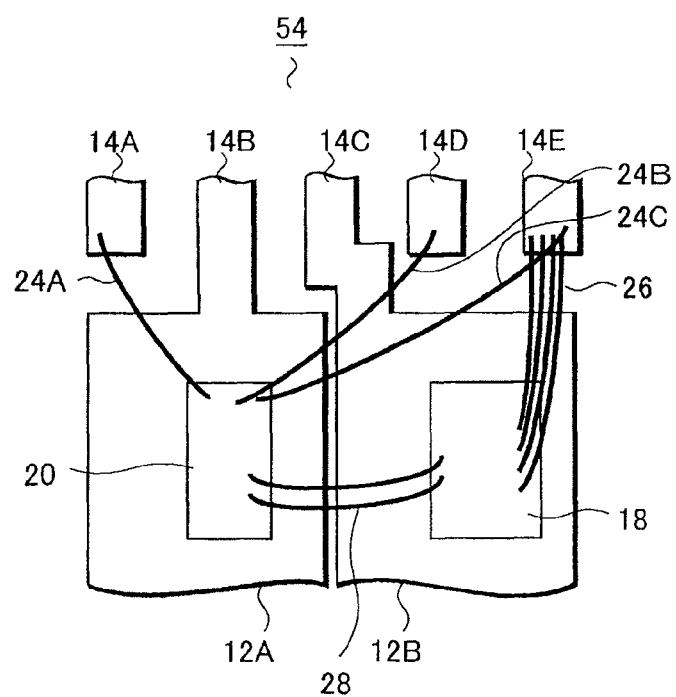

Next, with reference to FIG. 3, the elements fixedly attached to the islands 12A, 12B are electrically connected. Part (A) of FIG. 3 is a plan view showing this step, and Part (B) of FIG. 3 is an enlarged plan view showing one of the units 54.

With reference to Part (B) of FIG. 3, in this step, the control element 20 and the switching element 18 are electrically connected using thin metal wires which each have a diameter of about 40 μm and are made of gold. Electrodes provided on the top surface of the control element 20 are connected to the leads 14A, 14D, 14E via the thin metal wires 24A, 24B, 24C, respectively. Moreover, a source electrode provided on the top surface of the switching element 18 is connected to the lead 14E via multiple thin metal wires 26. In addition, a gate electrode of the switching element 18 is connected to the electrode of the control element 20 via thin metal wires 28.

The thin metal wire 24C connecting the control element 20 and the lead 14E is arranged to cross the thin metal wires 26 at positions thereabove. In this step, firstly, the source electrode of the switching element 18 and the lead 14E are connected via the thin metal wires 26. One ends of the thin metal wires 26 are ball-bonded to the source electrode of the switching element 18 at regular intervals. Meanwhile, the other ends of the thin metal wires 26 are stitch-bonded to a portion near the end of the lead 14E at regular intervals. Since a large electrical current passes through the source electrodes of the switching element 18, the multiple thin metal wires 26 are used to reduce an on-resistance.

After the connection of the thin metal wires 26 are completed, the control element 20 and the lead 14E are connected by the thin metal wire 24C. One end of the thin metal wire 24C is connected to the rightmost electrode of the control element 20, and the other end thereof is connected to the lead 14E. At this time, the other end of the thin metal wire 24C is disposed on the right side (outer side) of the center of the lead 14E. This configuration causes the lead 14D adjacent to the lead 14E and the thin metal wire 24C to be positioned away from each other, and thus the short circuit of the two is prevented.

Figure 4A:
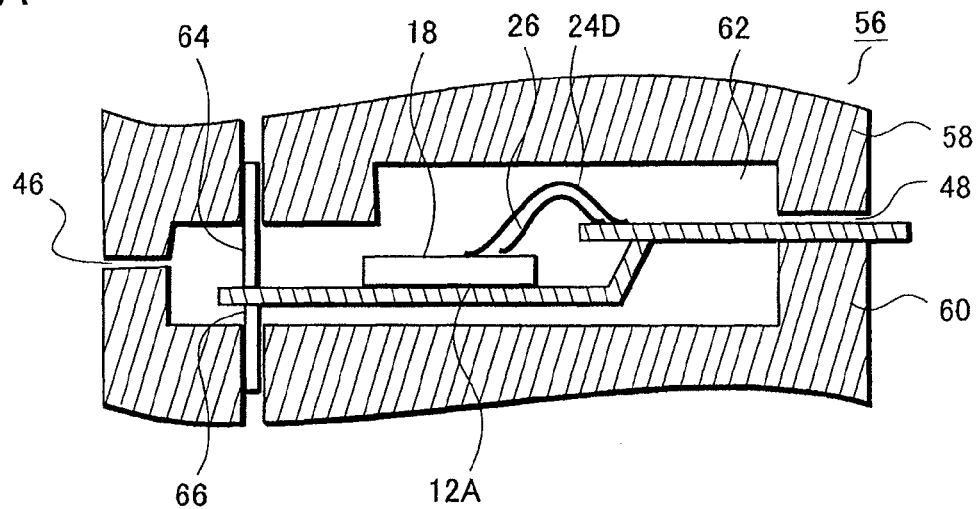
FIG. 4 is a view showing the method of manufacturing the semiconductor device of the present invention, Part (A) of FIG. 4 is a cross sectional view, Part (B) of FIG. 4 is a plan view, and Part (C) of FIG. 4 is an enlarged plan view.
Figure 4B:
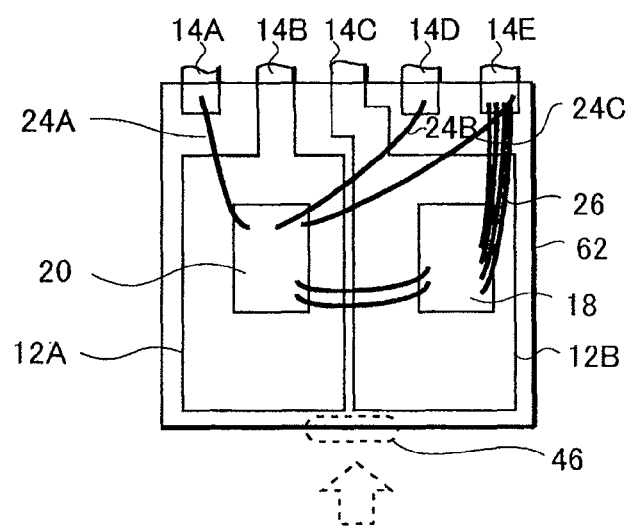
Figure 4C:
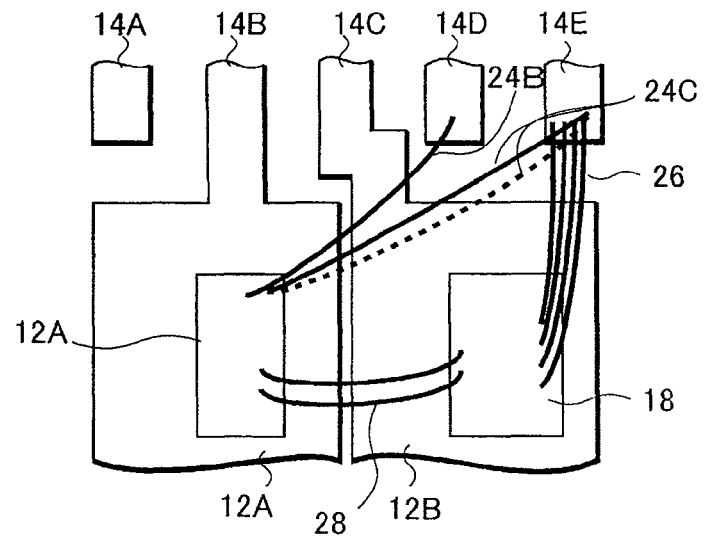

Next, with reference to FIG. 4, resin encapsulating is performed to cover the control element 20 and the like. Part (A) of FIG. 4 is a cross-sectional view showing this step, Part (B) of FIG. 4 is a plan view showing this step, and Part (C) of FIG. 4 is an enlarged plan view.

With reference to Part (A) of FIG. 4, in this step, the resin encapsulating is performed using a molding die 56. The molding die 56 is formed of an upper die 58 and a lower die 60. A cavity 62 into which the encapsulating resin is to be injected is formed by bringing the two dies into contact with each other. A transfer molding using a thermosetting resin is used as a method of the resin encapsulating.

The encapsulating method is specifically described below. Firstly, the island 12A and the island 12B subjected to the preceding step of wire bonding is accommodated in the cavity 62. At this time, a portion near the front end of the island 12A is pressed and fixed in a thickness direction by pressing portions (moveable pins) 64, 66 to prevent the island 12A from lifting due to the encapsulating pressure. Similarly, top and bottom main surfaces of the island 12B are fixed by the pressing portions. The pressing portion 64 is a moveable pin provided in the upper die 58, and the lower end thereof is in contact with the top surface of the island 12A. The pressing portion 66 is a moveable pin provided in the lower die 60, and the upper end thereof is in contact with the bottom surface of the island 12A. Next, the encapsulating resin is injected into the cavity 62 from a gate 46 provided in the molding die 56, and the islands 12A, 12B, the control element 20, the switching element 18, the leads 14, and the thin metal wires are encapsulated with the resin. The injection of the encapsulating resin causes the air inside the cavity 62 to be released to the outside through an air vent 48.

Furthermore, in this step, the pressing portions 64, 66 are pulled out in the course of setting of the encapsulating resin injected into the cavity 62. Thus, the top and bottom surfaces of the island 12A are covered with the encapsulating resin, and are not exposed to the outside.

Similarly, the top and bottom surfaces of the island 12B are fixed by the pressing portions described above.

With reference to Part (B) of FIG. 4, when the encapsulating resin in a liquid or semi-solid form is injected into the cavity 62 from the gate 46, the thin metal wires are curved due to the pressure of the injected encapsulating resin. In particular, the thin metal wire 24C connecting the lead 14E disposed in the end portion and the control element 20 is likely to deform. This is because the thin metal wire 24C is disposed in a manner inclined with respect to the flow of the encapsulating resin and thus receives a large pressure from the resin.

Part (C) of FIG. 4 shows the deformed thin metal wire 24C. In the drawing, the thin metal wire 24C before the deformation is illustrated in a dotted line, and the thin metal wire 24C after the deformation is illustrated in a solid line. As described above, the thin metal wire 24C is disposed in such a manner as to cross the thin metal wires 26 at the positions above the thin metal wires 26. Thus, when the thin metal wire 24C deforms toward the lead 14D by the resin pressure, the thin metal wire 24C comes into contact with the thin metal wires 26 and is supported by thin metal wires 26. At this point, the deformation of the thin metal wire 24C stops. Hence, contact of the deformed thin metal wire 24C with the lead 14D is prevented. In addition, in this step, the multiple thin metal wires 26 are provided below the thin metal wire 24C. Accordingly, in the resin encapsulating, the deformation of the thin metal wire 24C is suppressed by the sufficient supporting force of the multiple thin metal wires 26. Moreover, the thin metal wires 26 are formed more parallel to the flow of the encapsulating resin than the thin metal wire 24C is. Thus, the deformation by the pressure of the encapsulating resin is relatively small.

Figure 5:
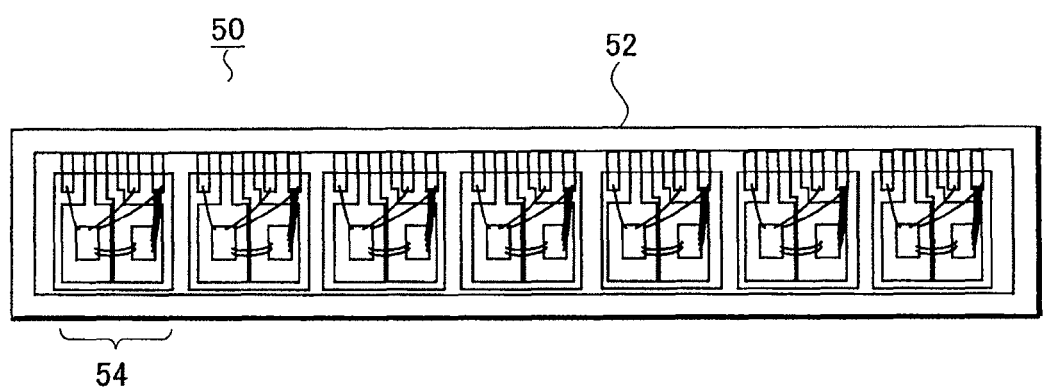
FIG. 5 is a plan view showing the method of manufacturing the semiconductor device of the present invention.
Figure 6:
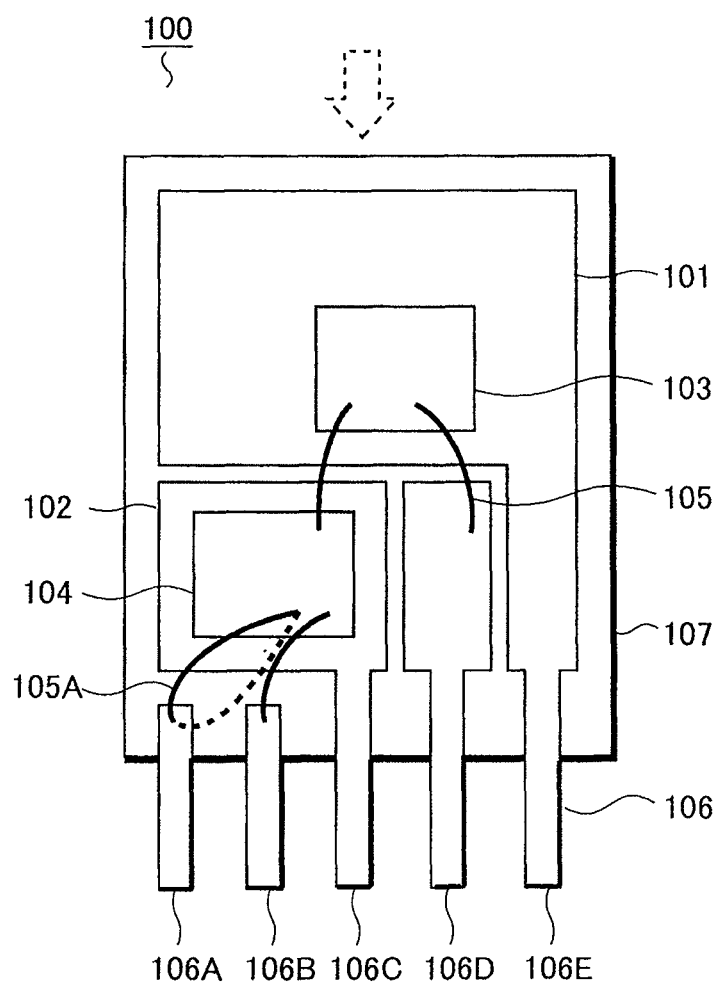
FIG. 6 is a plan view showing a semiconductor device of a background art.

FIG. 5 shows the lead frame 50 after the resin encapsulating is completed. Here, the units 54 provided in the lead frame 50 are collectively and simultaneously resin-encapsulated.

After this step is completed, the leads of the each unit 54 are separated from the outer frame 52 of the lead frame 50 by blanking. Then, the separated semiconductor devices are each mounted on a mount substrate, for example. Moreover, the top surfaces of the leads are coated with a plating film such as a solder plating to prevent the oxidation of the leads exposed to the outside.

The semiconductor device 10 having the structure shown in FIG. 1 is manufactured by the steps described above.

The invention claimed is:

1. A method of manufacturing a semiconductor device, comprising:

providing a lead frame comprising a first island, a second island separated from the first island and a plurality of leads each having one end located close to the first island or the second island;

attaching a first semiconductor element to the first island;

attaching a second semiconductor element to the second island;

connecting, by a first metal wire, the first semiconductor element to one of the leads disposed closer to the second island than the first island;

connecting, by a second metal wire, the second semiconductor element to the one of the leads so that the second metal wire crosses the first metal wire;

placing the lead frame in a molding die so that the two islands and portions of the leads are accommodated in a cavity of the molding die;

injecting an encapsulating resin into the cavity from a resin injection port disposed on a side that is opposite form a side on which the one of the leads is disposed, wherein the first metal wire is closer to the resin injection port than the second metal wire is at a position where the first metal wire crosses over the second semiconductor element, and an end portion of the one of the leads is disposed higher than the first semiconductor element and the second semiconductor element.

2. The method of manufacturing a semiconductor device according to claim 1, wherein, during the injecting of the encapsulating resin, the first metal wire deformed by the injection of the encapsulating resin comes into contact with the second metal wire.

3. The method of manufacturing a semiconductor device according to claim 2, wherein the second metal wire comprises a plurality of metal wires.

4. The method of manufacturing a semiconductor device according to claim 1, wherein a portion of the one of the leads which is connected to the first metal wire is further away from the first semiconductor element than a portion of the one of the leads which is connected to the second metal wire is.

5. The method of manufacturing a semiconductor device according to claim 1, wherein a plurality of leads are disposed on the same side as the one of the leads, and the one of the leads is disposed further away from the first semiconductor element than any other lead on the same side.

6. The method of manufacturing a semiconductor device according to claim 1, wherein during the injecting of the encapsulating resin an end portion of the one of the leads is higher than a gate of the molding die from which the encapsulating resin is injected.

* * * * *